United States Patent
Gotoh et al.

(10) Patent No.: US 7,987,590 B2
(45) Date of Patent: Aug. 2, 2011

(54) METHOD FOR MANUFACTURING AN ELECTRONIC PART

(75) Inventors: Masashi Gotoh, Tokyo (JP); Kaoru Kawasaki, Tokyo (JP); Hiroshi Yamamoto, Tokyo (JP); Mutsuko Nakano, Tokyo (JP); Hajime Kuwajima, Tokyo (JP)

(73) Assignee: TDK Corporation, Tokyo (JP)

( * ) Notice: Subject to any disclaimer, the term of this patent is extended or adjusted under 35 U.S.C. 154(b) by 1129 days.

(21) Appl. No.: 10/546,873

(22) PCT Filed: Feb. 26, 2004

(86) PCT No.: PCT/JP2004/002266

§ 371 (c)(1), (2), (4) Date: Jun. 2, 2006

(87) PCT Pub. No.: WO2004/077905

PCT Pub. Date: Sep. 10, 2004

(65) Prior Publication Data

US 2006/0258057 A1    Nov. 16, 2006

(30) Foreign Application Priority Data

Feb. 27, 2003  (JP) .................................. 2003-051225

(51) Int. Cl.
*H01K 3/22* (2006.01)

(52) U.S. Cl. ................ 29/848; 29/830; 29/831; 29/846; 174/255

(58) Field of Classification Search .................... 29/830, 29/831, 842, 844, 846–849; 174/255; 257/737; 361/784; 438/763

See application file for complete search history.

(56) References Cited

U.S. PATENT DOCUMENTS 4,991,285 A * 2/1991 Shaheen et al. ................. 29/830
5,600,103 A * 2/1997 Odaira et al. ................. 174/265

FOREIGN PATENT DOCUMENTS

| JP | 03-185793 | 8/1991 |
| JP | 4-119655 | 4/1992 |
| JP | 5-299535 | 11/1993 |
| JP | 6-57455 | 8/1994 |
| JP | 42164/1995 | 7/1995 |
| JP | 7-307564 | 11/1995 |

(Continued)

OTHER PUBLICATIONS

U.S. Appl. No. 10/537,286, filed Jun. 1, 2005, Gotoh et al.

(Continued)

*Primary Examiner* — Donghai D. Nguyen
(74) *Attorney, Agent, or Firm* — Oblon, Spivak, McClelland, Maier & Neustadt, L.L.P.

(57) ABSTRACT

An insulating sheet including resin is attached to a conductor portion composed of a wiring pattern and a columnar conductor from above. Then pressure and heat are applied to the insulating sheet using the columnar conductor as a stopper to form a layer of resin having a uniform thickness with the height of the columnar conductor being a reference to cover the conductor portion. In such method for manufacturing an electronic part, a projecting portion is formed outside a part formation area. In this substrate sheet, the amount of the resin required for forming the layer is computed based on the proportion of the volume taken up by the conductor portion in a domain including the projecting portion, and the thickness of the insulating sheet is set in accordance with the computed resin amount.

3 Claims, 5 Drawing Sheets

FOREIGN PATENT DOCUMENTS

| | | |
|---|---|---|
| JP | 10-022636 | 1/1998 |
| JP | 10-065047 | 3/1998 |
| JP | 10-65047 | 3/1998 |
| JP | 11-261198 | 9/1999 |
| JP | 2000-269642 | 9/2000 |
| JP | 2000-286554 | 10/2000 |
| JP | 2001-118883 | 4/2001 |
| JP | 2001-177237 | 6/2001 |
| JP | 2002-134881 | 5/2002 |
| JP | 2002-137328 | 5/2002 |
| JP | 2002-368369 | 12/2002 |

OTHER PUBLICATIONS

U.S. Appl. No. 10/540,249, filed Jun. 22, 2005, Gotoh et al.

* cited by examiner

PART FORMATION AREA | PROJECTING PORTION

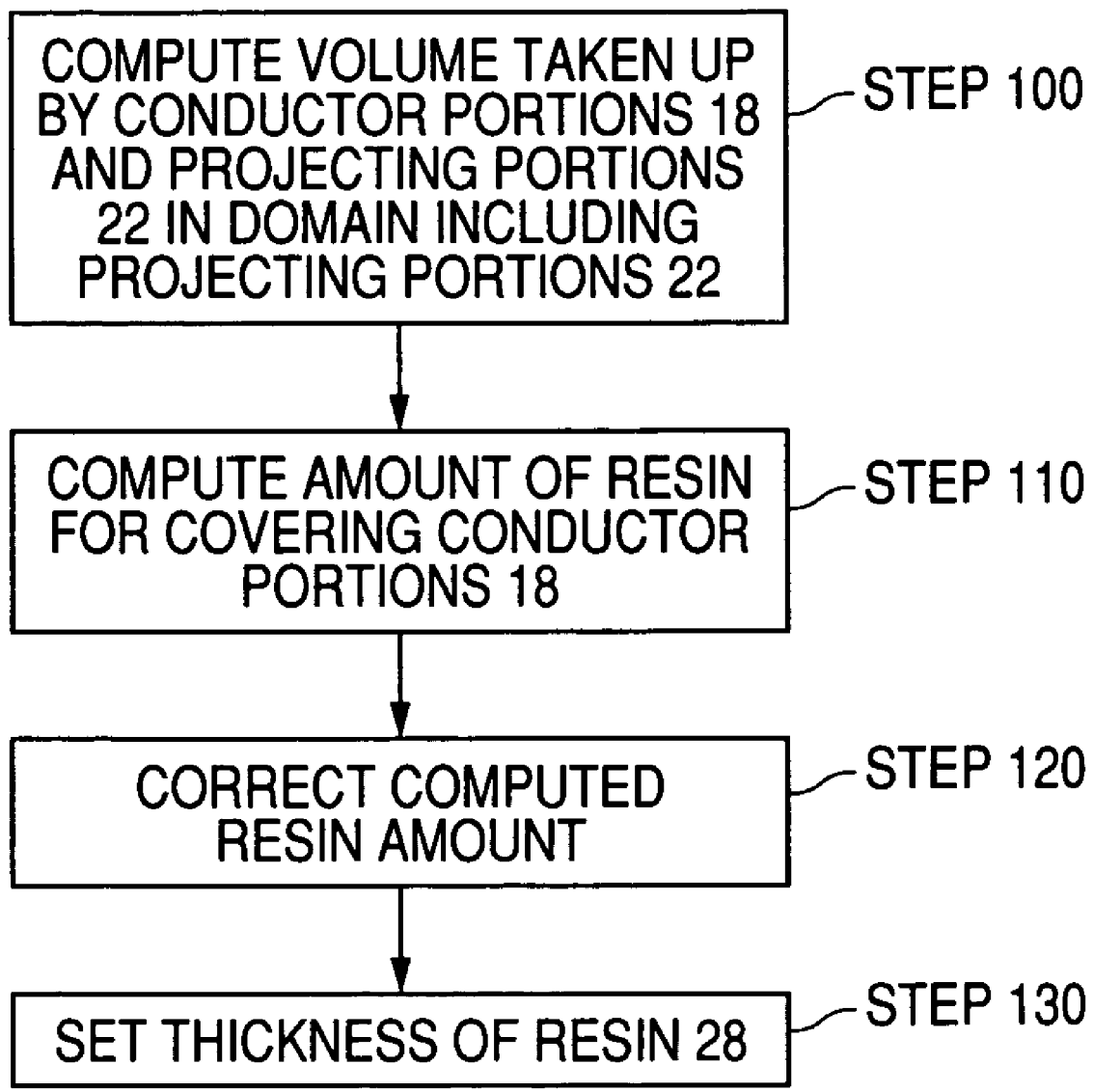

BACKGROUND ART

METHOD FOR MANUFACTURING AN ELECTRONIC PART

TECHNICAL FIELD

The present invention relates to a method for manufacturing an electronic part and to a substrate sheet, and particularly to a method for manufacturing an electronic part in which an electrode portion including a wiring pattern etc. is covered with resin, and to a substrate sheet.

BACKGROUND ART

Heretofore, an electronic part and a printed wiring board that have a multilayer structure produced by forming a wiring pattern on an insulating layer and stacking wiring patterns thus formed along their thickness direction have been known.

Various methods of producing such a structure have been proposed and disclosed. FIGS. 5A and 5B are diagrams illustrating steps in a conventional process of producing each layer of an electronic part.

In the step shown in FIG. 5A, a surface of an insulating layer 1 is perforated by irradiation with a layer beam. After a hole 2 is formed by the laser processing, the hole is filled with an electrically conductive paste, or a conductor portion in the form of a film or a column is formed in the hole 2 by plating.

In the step shown in FIG. 5B, conductor portions 4 are formed by plating or etching on a surface of an insulating layer 3, which has been produced in advance. After the conductor portions 4 have been formed by the above process steps, an insulating resin 5 is applied on the surface of the conductor portions 4 by spin coating (see, for example, patent document 1).

In a different known method, a bump of an electrically conductive paste is formed on wiring on a board, then an insulating material for interlayer connection and a metal layer are provided, and the bump is caused to penetrate a molded resin by a pressing process to achieve electrical connection between said bump and the metal layer (see, for example, patent document 2).

Furthermore, a method in which a via hole conductor is formed by forming a through hole by means of a carbon dioxide gas laser or other means and filing the through hole with a paste containing powder of a low resistance metal such as gold, silver, copper and aluminum has also been disclosed (see, for example, patent document 3).

Still further, a method in which an insulating layer is formed by applying a resin around a conductor post for interlayer connection and then pressing the resin with a release film having appropriate surface roughness like an emery paper disposed between (see, for example, patent document 4).

In a different method that has been disclosed, a resin layer in the A stage on which a PET film serving as a protection film is attached is disposed in contact with a surface on which an electrically conductive projection is present, and a thermosetting insulating resin layer is formed by lamination. Then, the PET film is removed, the electrically conductive projection and wirings are brought into contact with each other to form an laminated member (see, for example, patent document 5).

Furthermore, a method of producing a wiring board in which a transfer original and a base board on which wiring is to be formed by transferring are pressed together in a state in which a spacer for keeping the film thickness of an insulating rein layer to a predetermined thickness is disposed therebetween has been disclosed (see, for example, patent document 6).

Patent Document 1: Japanese Patent Application Laid-Open No. 10-22636.
Patent Document 2: Japanese Patent Application Laid-Open No. 2002-137328.
Patent Document 3: Japanese Patent Application Laid-Open No. 2002-134881
Patent Document 4: Japanese Patent publication No. 6-57455
Patent Document 5: Japanese Patent Application Laid-Open No. 2001-177237
Patent Document 6: Japanese Patent Application Laid-Open No. 11-261198

In connection with electronic parts having a multilayer structure, incorporation of an element etc. in the interior of the electronic part has been considered in order to further increase density and functions. If an element such as a passive component is to be formed between wiring patterns stacked along the lamination direction, the distance between the aforementioned wiring patterns is an important factor that determines characteristics of the aforementioned element. Accordingly, from the viewpoint of stabilization of characteristics of the element, there has been a demand for a method for manufacturing an electronic part that enables reliable control of the distance between the aforementioned wiring patterns or the thickness of each layer in the electronic part.

Nevertheless, in the above-mentioned manufacturing method shown in FIG. 5A, a conductor portion is simply formed in a hole 2 that has been formed on an insulating layer 1 by a laser processing, but the overall thickness of the layer is not controlled.

In the manufacturing method shown in FIG. 5B, an insulating resin layer is formed to cover conductor portions by applying resin by spin coating. However, undulation is created on the surface of the insulating resin in accordance with presence/absence of the conductor portions 4, and therefore it is difficult to make the overall thickness of the layer uniform.

Furthermore, in the method in which a bump of electrically conductive paste is formed on wiring on a board and then the bump is caused to penetrate a molded resin by pressing, no consideration has been made on control of the overall thickness of the layer. Still further, Japanese Patent Application Laid-Open No. 2002-134881 only teaches to form a via hole conductor by filling paste, but no consideration is made on control of the overall thickness of the layer.

In the technology disclosed in Japanese Patent Publication 6-57455, it is necessary to remove the release film from the surface of the insulating layer after completion of the pressing process. However, there is a risk that an external force will act on the surface of the insulating layer in this removing operation and deformation etc. may occur on the surface of the insulating layer. In addition, since resin is applied to cover conductor portions as with the process shown in FIG. 5B, there is a risk that undulation will be created on the surface of the insulating resin and it will be difficult to make the overall thickness of the layer.

In the technology disclosed in Japanese Patent Application Laid-Open No. 2001-177237 also, an external force acts on the thermosetting insulating resin layer when the PET film is removed, and therefore, there is a risk that deformation may be created on the surface of the thermosetting insulating resin layer, as with the technology disclosed in the above-mentioned patent document. Accordingly, it might be difficult to make the overall thickness of the layer uniform.

In the method of setting the thickness of a layer by inserting a spacer as disclosed in Japanese Patent Application Laid- Open No. 11-261198, although it is possible to set the layer thickness, it is difficult to achieve connection between layers by a conductor portion at a predetermined position.

In such manufacturing methods, it has generally been desired, in order to reduce the manufacturing cost, to reduce the amount of the material used, namely to reduce surplus of the resin used for forming insulating layers.

DISCLOSURE OF THE INVENTION

The present invention has been made in view of the above-described problems of prior arts, and has as an object to provide a method for manufacturing an electronic part with which it is possible to make the thickness of an insulating layer uniform and to minimize the consumption amount of resin used for forming the insulating layer, and to provide a substrate sheet.

The present invention has been made based on the discovery that by providing a projecting portion for intercepting flow of resin outside an area in which electronic parts are to be formed (or a part formation area), it is possible to prevent the resin for forming an insulating layer from flowing outwardly, and therefore it is possible to form the insulating layer by the minimum necessary amount of resin.

In a method, according to the present invention, for manufacturing an electronic part by attaching an insulating sheet including resin to a wiring pattern from above, covering said wiring pattern with said resin by applying pressure and heat to said insulating sheet to form a layer having an uniform thickness, a projecting portion is provided outside a part formation area, the amount of said resin required for forming said layer is computed based on the volume taken up by said wiring pattern and said projecting portion in a domain including the projecting portion, and the thickness of said insulating sheet is set in accordance with the resin amount thus computed. It is preferred that said projecting portion and said wiring pattern be formed by the same process.

According to a more specific method for manufacturing an electronic part according to the present invention, in a method for manufacturing an electronic part by attaching an insulating sheet including resin to a conductor portion composed of a wiring pattern and a columnar conductor from above, covering said conductor portion with said resin by applying pressure and heat to said insulating sheet while using said columnar conductor as a stopper to form a layer having an uniform thickness, a projecting portion is provided outside a part formation area, the amount of said resin required for forming said layer is computed based on the volume taken up by said conductor portion and said projecting portion in a domain including the projecting portion, and the thickness of said insulating sheet is set in accordance with the resin amount thus computed. It is preferred that a dummy pattern and a columnar structure that constitute said projecting portion, and said wiring pattern and said columnar conductor that constitute said conductor portion be formed by the same process.

In a substrate sheet according to the present invention, a part formation area is set on the surface of the substrate sheet, a conductor portion is formed within the part formation area, and a projecting portion for increasing flow resistance of insulating resin for covering said conductor portion is formed outside said part formation area.

In a substrate sheet according to a more specific mode of the present invention, a part formation area is set on the surface of the substrate sheet, a conductor portion composed of a wiring pattern and a columnar conductor for achieving interlayer connection is formed within the part formation area, and a projecting portion for increasing flow resistance of insulating resin for covering said conductor portion is formed outside said part formation area. It is preferred that said projecting portion have a form the same as said conductor portion. In addition, it is preferred that a plurality of parts be produced from said part formation area.

In the above described structure, after the wiring pattern is formed on the substrate sheet, the insulating sheet is attached to said wiring pattern from above. After the insulating sheet is attached, the temperature of the pressing plate disposed on the rear side of the insulating sheet is increased to heat the insulating sheet. By applying pressure by said pressing plate while applying heat, the conductor portion is caused to penetrate into the resin of the insulating sheet. After the columnar conductor is taken into the interior of the insulating sheet by continuous application of pressure and heat, pressure application is stopped at a certain position. Thus, it is possible to ensure a specific layer thickness in accordance with the position at which pressure application is stopped.

According to the other more specific structure, after the conductor portion composed of the wiring pattern and the columnar conductor is formed to produce the structure of the substrate sheet, the insulating sheet is attached to the wiring pattern and the columnar conductor from above. After the insulating sheet is attached, the temperature of the pressing plate disposed on the rear side of the insulating sheet is increased to heat the insulating sheet. By applying pressure by said pressure plate while applying heat, the conductor portion is caused to penetrate into the resin of the insulating sheet. As the columnar conductor is taken into the interior of the insulating sheet by continuous application of pressure and heat, the top portion of the columnar conductor comes in contact with the pressing side surface of the insulating sheet. Pressure and heat application is stopped in the state in which the top portion of the columnar conductor is in contact with the pressing side surface of the insulating sheet as above, wherein the columnar conductor function as a stopper. Thus, the thickness of the insulating sheet (or the insulating layer) becomes equal to the height of the columnar conductor, and it is possible to ensure a specific layer thickness.

Since the resin in the aforementioned insulating sheet has fluidity when heated, when heat and pressure are applied to the insulating film, said resin fills stepped portions and gaps around the wiring pattern and the columnar portion, and the resin tends to extend outwardly from the part formation area. However, since the projecting portion is formed outside the part formation area, flow resistance of the resin increases when the resin reaches the projecting portion. Therefore, it is possible to reduce the amount of the resin that moves outwardly beyond the boundary of the projecting portion (when pressure and heat are applied).

In view of this, the volume taken up by said conductor portion and said projecting portion within a domain including the projecting portion is firstly computed, and then based on a value thus obtained, the amount of resin for forming a new layer covering said conductor portion is computed. After that, the thickness of the insulating sheet is determined based on the resin amount thus computed. Thus, it is possible to prevent a large amount of resin from flowing out of the domain including the projecting portion and to cover the domain including the projecting portion with the minimum necessary resin amount. By the above process, it is possible to minimize the surplus resin around the conductor portion and to achieve a reduction in the resin consumption. In addition, since it is possible to determine the resin amount appropriately, it is possible to eliminate unevenness of the resin that might occur upon pressing if there is surplus resin, or it is possible to prevent detachment between layers that might be caused if the resin is insufficient.

The projecting portion and the conductor portion may be formed by the same process step. In that case, it is not necessary to form the conductor portion and the projecting portion by separate process steps, and therefore, it is possible to simplify the process. Moreover, since the projecting portion and the columnar conductor have the same height, when the insulating sheet is pressed while applying heat, it is possible to form a uniform layer without inclination of the sheet between the projecting portion and the columnar conductor. A plurality of electronic parts may be manufactured from the part formation area. Thus, it is possible to manufacture a large number of electronic parts while reducing the consumption amount of the resin.

BRIEF DESCRIPTION OF THE DRAWINGS

FIG. 1A is a plan view, and FIG. 1B is a cross sectional view taken along line 1B-1B in FIG. 1A.

FIG. 4 is a flow chart of a process of setting the thickness of resin.

THE BEST-MODE FOR CARRYING OUT THE INVENTION

In the following, a preferred embodiment of a method for manufacturing an electronic part and a substrate sheet according to the present invention will be described with reference to the drawings.

Figure 1A:
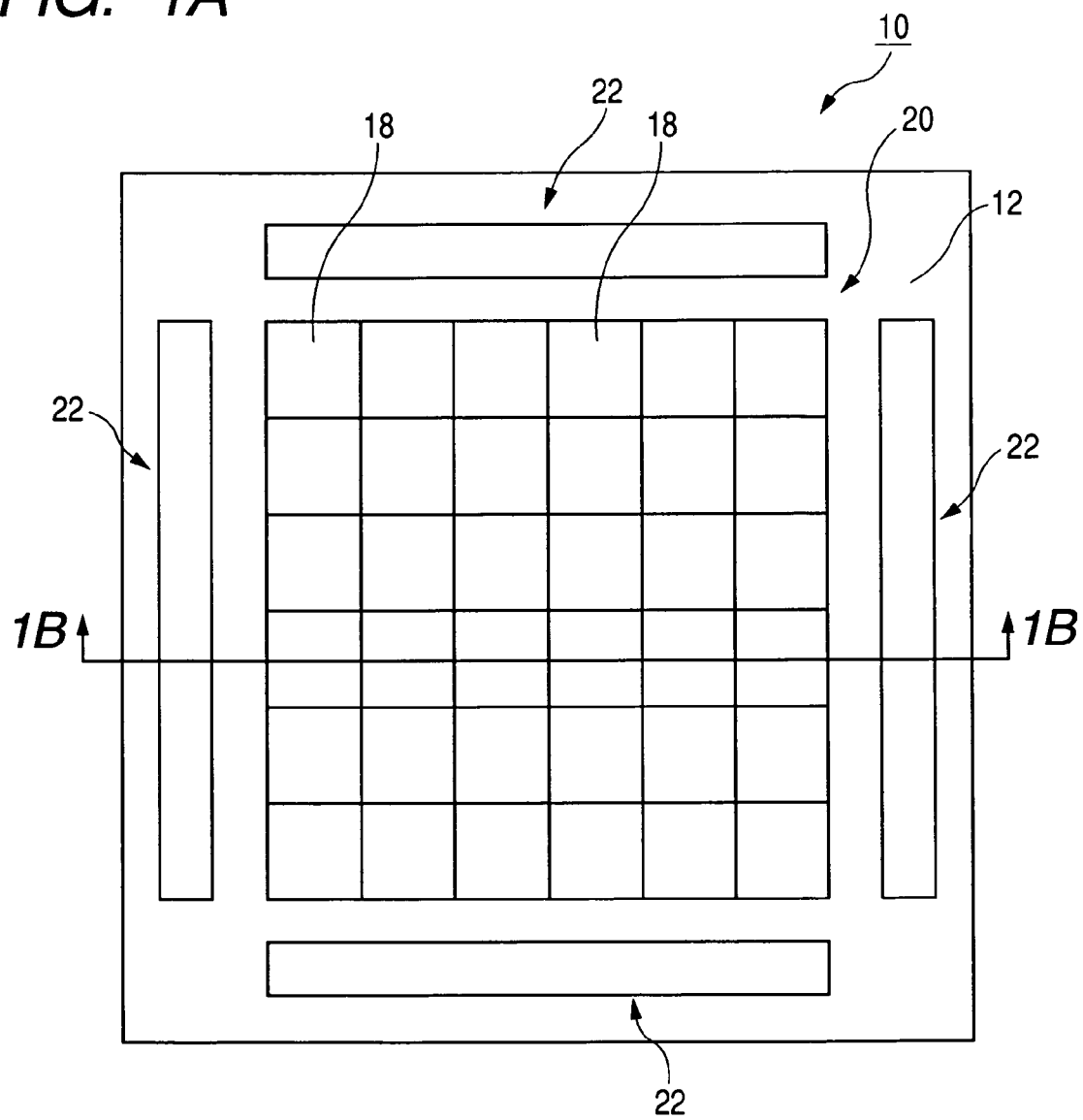
FIGS. 1A and 1B illustrate the structure of a substrate sheet according to an embodiment.
Figure 1B:
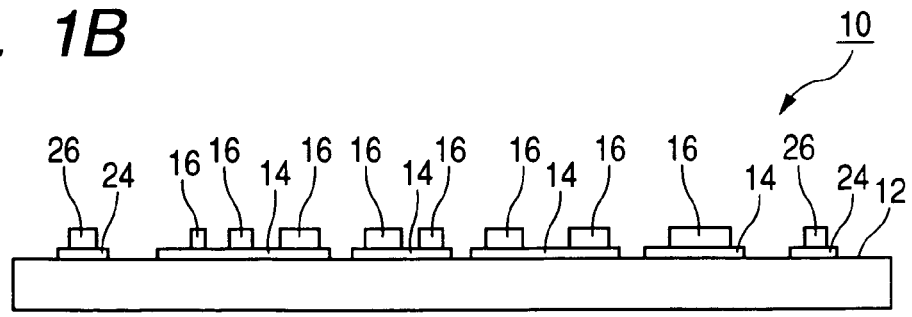

FIGS. 1A and 1B illustrate a substrate sheet according to an embodiment. FIG. 1A is a plan view, and FIG. 1B is a cross sectional view taken along line 1B-1B in FIG. 1A. As shown in these drawings, wiring patterns 14 and columnar conductors 16 (so-called posts) serving as interlayer connecting portions are formed on a surface of the substrate sheet 10 according to this embodiment. The wiring patterns 14 and the columnar conductors 16 constitute conductor portions 18.

A part formation area 20 is set in the central portion of the substrate sheet 10, and the plurality of conductor portions 18 mentioned above are formed in this part formation area so that a plurality of electronic parts are to be to be produced therein.

Outside the part formation area 20 on the substrate sheet 10, projecting portions 22 are formed in a manner as to surround the part formation area 20. The projecting portions 22 are composed of dummy patterns 24 that do not contribute to production of electronic parts and columnar structures 26. The dummy patterns 24 and the wiring patterns 14 are made of the same material and have the same thickness, and the columnar structures 26 and the columnar conductors 16 have are made of the same material and have the same thickness. These portions are formed by the same process.

Although, in this embodiment, the dummy patterns 24 and the wiring patterns 14 are made of the same material and have the same thickness, and the columnar structures 26 and the columnar conductors 16 are made of the same material and have the same thickness, the present invention is not limited to these features. They may be composed of different materials, and they may have different thicknesses.

In the following, a process of producing a substrate sheet 10 and a process of manufacturing electronic parts using the substrate sheet 10 will be described.

Figure 2A:
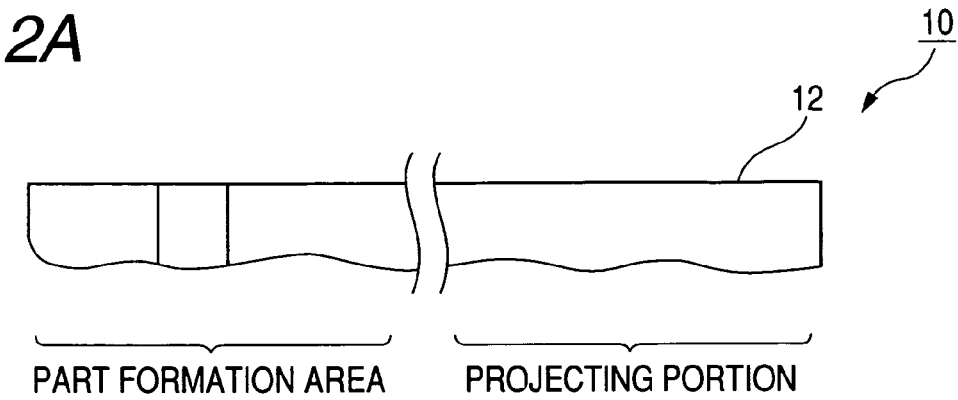
FIGS. 2A to 2C are diagrams illustrating a process of producing the substrate sheet.
Figure 2B:
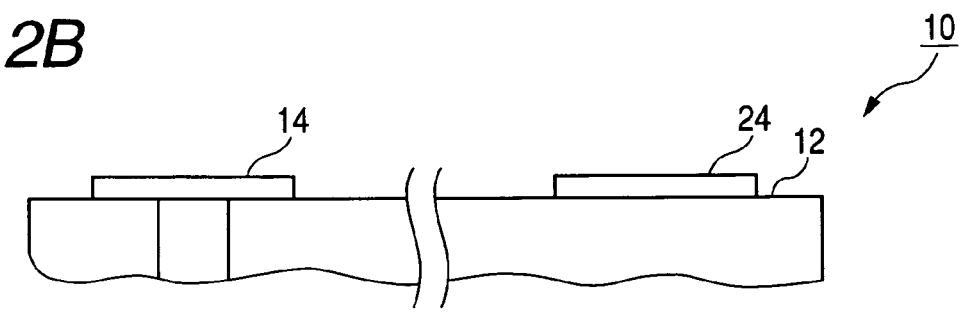
Figure 2C:
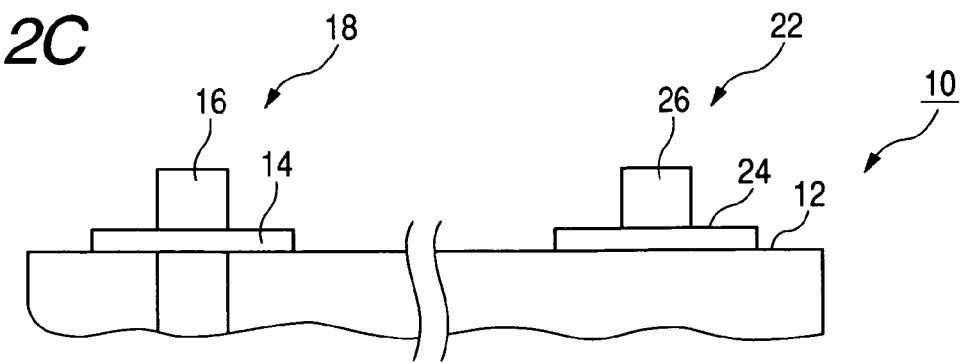

FIGS. 2A to 2C illustrate steps in the process of producing a substrate sheet. The left hand portions of FIGS. 2A to 2C show a process of forming conductor portions in the part formation area, and the right hand portions show projecting portions that are formed by the process same as the process of forming the aforementioned conductor portions.

As shown in FIG. 2A, to produce a substrate sheet 10, a power supply film (not shown) to be used in a plating process is formed on the surface 12. After the power supply film is formed, wiring patterns 14 and dummy patterns 24 are formed on the surface 12 by attaching a dry film serving as a resist, exposing the resist, plating and other process steps. The state after the wiring patterns 14 and the dummy patterns 24 have been formed is shown in FIG. 2B. After these patterns have been formed, columnar conductors 16 and columnar structures 26 are formed on the wiring patterns 14 and the dummy patterns 24 by attaching a dry film, exposing the dry film, plating and other process steps, in a similar manner. The state after the columnar conductors 16, 26 have been formed is shown in FIG. 2C.

Although in the above-described embodiment, the columnar conductors 16 are formed on the wiring patterns 14, the present invention is not limited to this feature. The columnar conductor 16 may be directly formed without forming the wiring patterns 14, or the columnar structure 26 may be directly formed without forming the dummy patterns 24.

By adopting the above-described production process, it is possible to reduce the number of process steps, since it is not necessary to form the conductor portions 18 and the projecting portions 22 separately. In addition, it is possible to make the heights of the columnar conductors 16 and the columnar structures 26 equal, and it is possible to improve uniformity in the thickness of the layer formed on the surface 12 of the substrate sheet 10. In this embodiment, although the portions below the surface 12 of the substrate 10 are not shown in the drawings, the embodiment may be arranged in such a way that wiring patterns 14 are stacked in multiple layers and such multiple layers of wiring patterns 14 are connected by the columnar conductors 16.

Figure 3A:
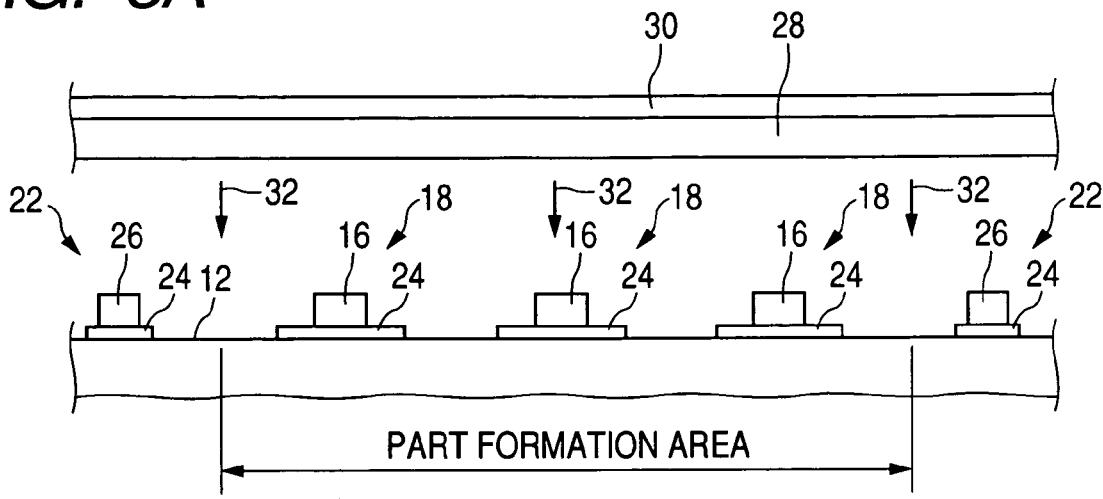
FIG. 3A to 3C illustrate a sequence of a process of manufacturing an electronic part according to the embodiment.
Figure 3B:
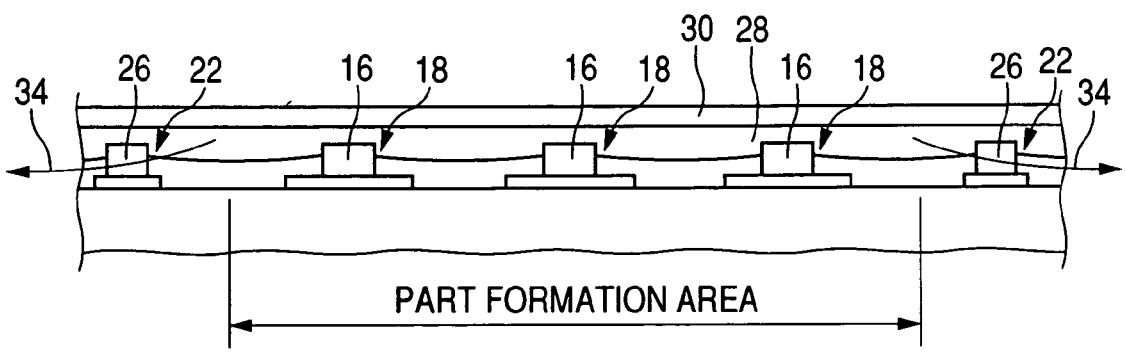

After the conductor portions 18 and the projecting portions 22 have been formed, a copper foil 30 on which a resin in the form of a thermosetting insulating sheet in a B-stage state or a thermoplastic insulating sheet is attached is lowered along the direction indicated by arrows 32, as shown in FIG. 3A. The aforementioned resin 28 may preferably be a thermoplastic resin compound such as polyolefin, fluorocarbon resin, liquid crystal polymer, polyetherketone and polyphenylene sulfide or a thermosetting resin compound such as a unsaturated polyester resin, polyimide resin, epoxy resin, bismaleimide triazine resin, phenol resin, polyphenylene oxide and polyvinyl benzilether.

To control characteristics such as fluidity, a filler may be added to the resin 28 when deemed appropriate.

Here, the B-stage substrate sheet refers to such a sheet that is in a state in which curing of the thermosetting resin has been stopped halfway, and when heated further, it will be once melted and then eventually cured completely. It is more preferable that the temperature in heating be higher than the melting point or softening point of the resin. On the side of the copper foil 30 that is opposite to the side on which the resin 28 is formed, there is provided pressurizing means for pressing the copper foil 30 with the resin 28 attached thereto, although it is not shown in the drawings. Thus, it is possible to press the copper foil 30 with the resin 28 attached thereto against the substrate sheet 10 while heating it under a reduced pressure condition (namely, so-called heat pressing under vacuum is performed).

The size (or area) of the copper foil 30 with the resin 28 is arranged to be large enough to cover the area on the substrate sheet 10 that includes at least the projecting portions 22. With a view to minimize the consumption amount of the resin 28 to thereby reduce the manufacturing cost, the thickness of the resin 28 is determined through the following process.

FIG. 4 is a flowchart of a process of determining the thickness of the resin.

As shown in FIG. 4, to determine the thickness of the resin 28 attached to the copper foil 30, the volume taken up by the conductor portions 18 and the projecting portions 22 in a domain including the projecting portions 22 on the substrate sheet 10 is computed (step 100). Then based on the value of the volume thus obtained, the amount of resin that will cover said conductor portions 18 is computed (step 110). After the resin amount has been computed as per the above based on the proportion of the conductor portions, correction is performed on the computed resin amount taking into account variations of components (step 120). After that, the thickness of the resin 29 attached to the copper foil 30 is determined based on the corrected resin amount (step 130).

In connection with the above, by preparing plural types of copper foils 30 with resin 28 of different thicknesses attached thereto, and selecting the copper foil 30 having the optimum specification, it is possible to eliminate a surplus portion of the resin 28 and to improve the manufacturing efficiency.

After the thickness of the resin 28 has been determined by the above-described computation, the copper foil 30 with the resin attached thereto is lowered from the position shown in FIG. 3A along the direction indicated by arrows 32. The copper foil 30 with the resin 28 attached thereto eventually comes in contact with the columnar conductors 16 and the columnar structures 26. As the lowering further progresses, the resin 28 pressed by the columnar conductors 26 tends to move in the directions indicated by arrows 34, namely tends to extend outwardly from the part formation area 20. However, since projecting portions 22 are formed outside the part formation area 20, flow resistance of the resin 28 that is about to pass over the projecting portions 22 increases. Consequently, the resin 28 that moves outwardly is dammed up by the projecting portions 22, and the resin remain in the domain including the projecting portions 22 for the most part. Thus, it is possible to make the thickness of the resin 28 uniform in the domain including the projecting portions 22.

To verify advantageous effects of the present invention, the inventor performed various comparative examinations.

Figure 3C:
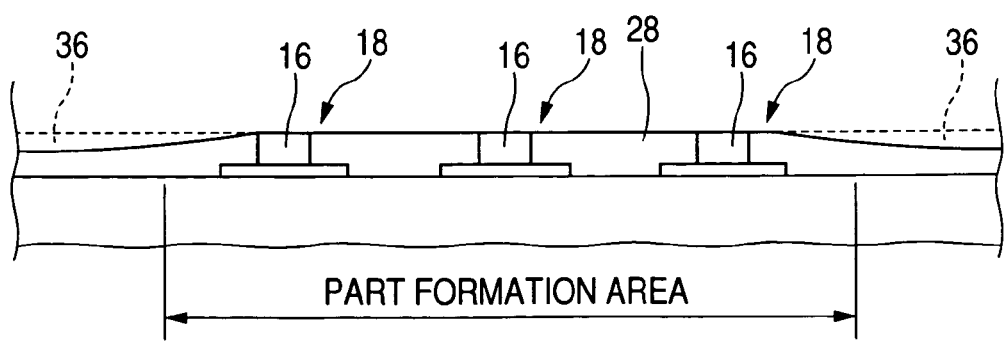
Figure 5A:
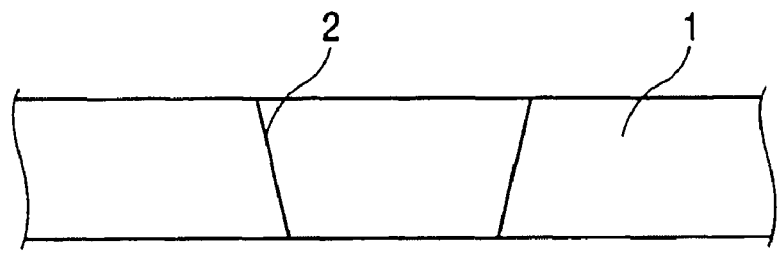
FIG. 5A to 5B illustrate a conventional process of forming layers of an electronic part.
Figure 5B:
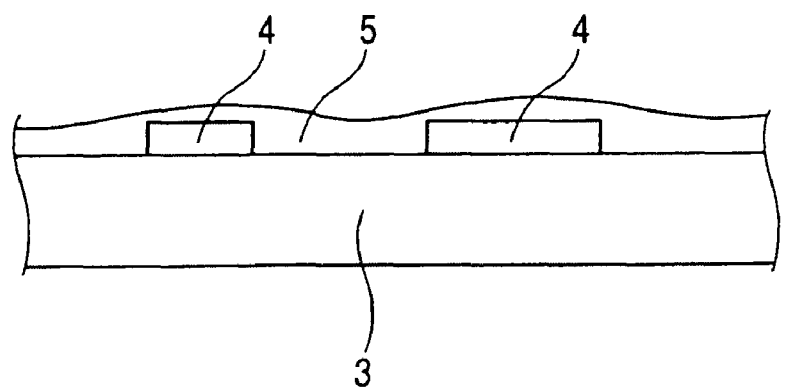

FIG. 3C shows an arrangement in which the projecting portions 22 outside the part formation area 20 have been eliminated. In such an arrangement, dented portions 36 are formed in the resin 28, and it will be understood that it is difficult to form the resin 28 uniformly in the part formation area.

When the columnar conductors 16 and the columnar structures 26 come in contact with the copper foil 30, the columnar conductors 16 function as stoppers and receive the pressing force applied by the pressing means equipped with heating means to stop the descent of the pressing means. When the descent of the pressing means is stopped and the stoppage of the descent is detected, it is assumed that the copper foil 30 has come in contact with the columnar conductors. Thus, the lowering operation is stopped, and the state in which the top of the columnar conductors is in contact with the copper foil 30 is maintained while heating is continued until the resin 28 is cured. After the resin 28 is cured, the pressing means is retracted upwardly, and thereafter, the resin 28 may be removed from the copper foil 30 by etching (which is a chemical reaction).

By providing the projecting portions 20 for increasing flow resistance formed outside the part formation area 20, it is possible to reduce the amount of the resin 28 flowing outwardly, and it is possible to reduce the amount of surplus resin. In addition, the area within which the resin extends is reduced, and therefore it is possible to make the size of the apparatus for manufacturing an electronic part small and to reduce the space required for equipments.

Although the above description of this embodiment has been directed to a case in which the conductor portions are composed of wiring patterns and columnar conductors, the present invention is not limited to this particular form. It is apparent that only wiring patterns and projecting portions may be formed on a substrate sheet without forming columnar conductors, and the resin thickness for achieving a required film thickness may be computed based on the volume taken up in a domain including the projecting portions so that the computed thickness is applied to an insulating sheet. Although the above-described projecting portions are arranged in a single row in this embodiment, the present invention is not limited to this arrangement. The projecting portions may be arranged in a plurality of rows depending on various conditions such as manufacturing conditions.

As per the above, according to the present invention, in a method for manufacturing an electronic part by attaching an insulating sheet including resin to a wiring pattern from above, covering said wiring pattern with said resin by applying pressure and heat to said insulating sheet to form a layer having an uniform thickness, a projecting portion is provided outside a part formation area, the amount of said resin required for forming said layer is computed based on the volume taken up by said wiring pattern and said projecting portion in a domain including the projecting portion, and the thickness of said insulating sheet is set in accordance with the resin amount thus computed. More specifically, in a method for manufacturing an electronic part by attaching an insulating sheet including resin to a conductor portion composed of a wiring pattern and a columnar conductor from above, covering said conductor portion with said resin by applying pressure and heat to said insulating sheet while using said columnar conductor as a stopper to form a layer having an uniform thickness, a projecting portion is provided outside a part formation area, the amount of said resin required for forming said layer is computed based on the volume taken up by said conductor portion and said projecting portion in a domain including the projecting portion, and the thickness of said insulating sheet is set in accordance with the resin amount thus computed. Thus, it is possible to make the thickness of the insulating layer uniform and to minimize the consumption amount of the resin used for, forming the insulating layer.

What is claimed is:
1. A method for manufacturing an electronic part, comprising:
   forming a conductor portion including a wiring pattern and a columnar conductor in a part formation area of a substrate sheet;
   forming a projecting portion to surround the part formation area of the substrate sheet, including a gap providing communication from the part formation area to outside the projecting portion;

computing an amount of insulating resin required for forming an insulating layer in an area of the substrate sheet including the projecting portion pressing the substrate sheet with a foil including the computed amount of insulating resin thereon, contacting the foil with the columnar conductor;

softening the insulating resin by heating to cause the insulating resin to flow over the part formation area, the projecting portion increasing flow resistance of the softened insulating resin; and curing the insulating resin by further heating to form the insulating layer having a predetermined thickness based on the heights of the columnar conductor and the projecting portion, wherein the computed amount of insulated resin reflects a volume of insulating resin in the area of the substrate sheet including the projecting portion required to achieve the predetermined thickness, taking into account a volume of the conductor portion and the projecting portion, which is based on heights of the columnar conductor and the projecting portion, and the projecting portion is formed together with the wiring pattern and the columnar conductor in the same step.

2. The method according to claim 1, further comprising removing the foil after the curing.

3. The method according to claim 1, wherein the foil is a copper foil.

* * * * *